United States Patent
Li

(10) Patent No.: US 9,007,584 B2
(45) Date of Patent: Apr. 14, 2015

(54) SIMULTANEOUS MEASUREMENT OF MULTIPLE OVERLAY ERRORS USING DIFFRACTION BASED OVERLAY

(75) Inventor: Jie Li, Milpitas, CA (US)

(73) Assignee: Nanometrics Incorporated, Milpitas, CA (US)

( * ) Notice: Subject to any disclaimer, the term of this patent is extended or adjusted under 35 U.S.C. 154(b) by 495 days.

(21) Appl. No.: 12/978,922

(22) Filed: Dec. 27, 2010

(65) Prior Publication Data

US 2012/0162647 A1 Jun. 28, 2012

(51) Int. Cl.
*G01B 11/00* (2006.01)
*H01L 21/76* (2006.01)
*H01L 23/544* (2006.01)
*G03F 7/20* (2006.01)
*G03F 9/00* (2006.01)

(52) U.S. Cl.
CPC ........ *G03F 7/70633* (2013.01); *G03F 7/70683* (2013.01); *G03F 9/7076* (2013.01)

(58) Field of Classification Search
USPC ........................................................ 250/548
See application file for complete search history.

(56) References Cited

U.S. PATENT DOCUMENTS

| | | | |
|---|---|---|---|
| 6,772,084 B2 | 8/2004 | Bischoff et al. | |
| 6,982,793 B1 | 1/2006 | Yang et al. | |
| 7,170,604 B2 | 1/2007 | Sezginer | |
| 7,193,715 B2 | 3/2007 | Smedt et al. | |
| 7,230,704 B2 | 6/2007 | Sezginer et al. | |
| 7,230,705 B1* | 6/2007 | Yang et al. | 356/401 |
| 7,368,206 B2 | 5/2008 | Fay et al. | |
| 7,656,528 B2 | 2/2010 | Abdulhalim et al. | |
| 2006/0274310 A1* | 12/2006 | Kandel et al. | 356/369 |
| 2007/0229829 A1* | 10/2007 | Kandel et al. | 356/401 |
| 2008/0002213 A1* | 1/2008 | Weiss | 356/620 |
| 2008/0029913 A1* | 2/2008 | Taylor | 257/797 |
| 2008/0094630 A1* | 4/2008 | Mieher et al. | 356/401 |
| 2009/0296075 A1* | 12/2009 | Hu et al. | 356/73 |
| 2010/0214566 A1* | 8/2010 | Brill et al. | 356/401 |
| 2012/0224176 A1* | 9/2012 | Hammond | 356/401 |
| 2013/0278942 A1* | 10/2013 | Jeong et al. | 356/620 |

OTHER PUBLICATIONS

International Search Report and Written Opinion mailed on May 4, 2012 for PCT Application No. PCT/US2011/065799 filed on Dec. 19, 2011, 10 pages.
Li, Jie et al., "Advanced diffraction-based overlay for double patterning", Metrology, Inspection, and Process Control for Microlithography XXIV. Edited by Raymond, Christopher J. Proceedings of the SPIE, vol. 7638, pp. 76382C-76382C-10 (2010).

* cited by examiner

*Primary Examiner* — Gordon J Stock, Jr.
(74) *Attorney, Agent, or Firm* — Silicon Valley Patent Group LLP

(57) ABSTRACT

A plurality of overlay errors in a structure is determined using a target that includes a plurality of diffraction based overlay pads. Each diffraction based overlay pad has the same number of periodic patterns as the structure under test. Additionally, each diffraction based overlay pad includes a programmed shift between each pair of periodic patterns. The pads are illuminated and the resulting light is detected and used to simultaneously determine the plurality of overlay errors in the structure based on the programmed shifts. The overlay errors may be determined using a subset of elements of the Mueller matrix or by using the resulting spectra from the pads.

42 Claims, 8 Drawing Sheets

US 9,007,584 B2

SIMULTANEOUS MEASUREMENT OF MULTIPLE OVERLAY ERRORS USING DIFFRACTION BASED OVERLAY

BACKGROUND

Semiconductor processing for forming integrated circuits requires a series of processing steps. These processing steps include the deposition and patterning of material layers such as insulating layers, polysilicon layers, and metal layers. The material layers are typically patterned using a photoresist layer that is patterned over the material layer using a photomask or reticle. Typically, the photomask has alignment targets or keys that are aligned to fiduciary marks formed in the previous layer on the substrate. However, as the size of integrated circuit features continues to decrease, it becomes increasingly difficult to measure the overlay accuracy of one masking level to the previous level. This overlay metrology problem becomes particularly difficult at submicrometer feature sizes where overlay alignment tolerances are reduced to provide reliable semiconductor devices. One type of overlay measurement is known as diffraction based overlay metrology.

The overlay measurement problem is compounded when material layers are formed using more than two patterns, thereby producing a structure with multiple potential overlay errors. For example, a single layer may include two or three or more patterns produced by different reticles, with one or more overlying patterned layers, where each pattern must be accurately aligned with all other patterns. Alternatively, many layered patterns, more than two layers, may be formed with separate reticles, where again, each pattern must be accurately aligned with a preceding pattern. When three or more patterns are present, the alignment between each pattern must be measured resulting in two or more overlay error measurements. Conventionally, to measure multiple overlay errors, a separate set of targets is generated for each individual overlay error and the overlay errors are separately measured. Consequently, a large foot print is required for the large number of targets and throughput is reduced due to the number of separate measurements required.

SUMMARY

A diffraction based overlay target includes a plurality of diffraction based overlay pads which are used to simultaneously determine a plurality of overlay errors between a number of periodic patterns in a structure. Each diffraction based overlay pad has the same number of periodic patterns as the structure under test. Additionally, each diffraction based overlay pad includes a programmed shift between each pair of periodic patterns. The pads are illuminated and the resulting light is detected and used to simultaneously determine the plurality of overlay errors in the structure based on the programmed shifts. The overlay errors may be determined using a subset of elements of the Mueller matrix or by using the resulting spectra from the pads.

DETAILED DESCRIPTION

Figure 1:
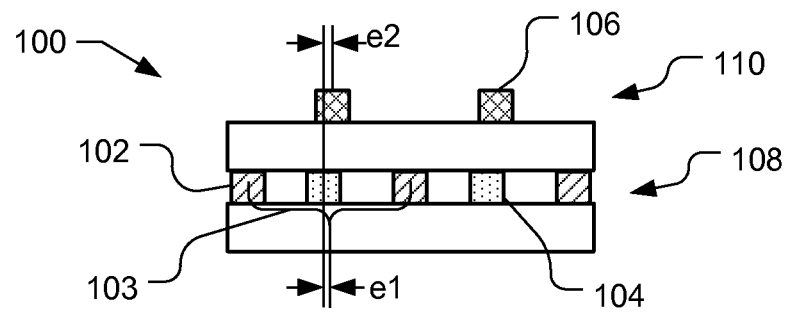
FIG. 1 illustrates a structure with a number of periodic patterns and a plurality of overlay errors to be simultaneously measured.
Figure 2:
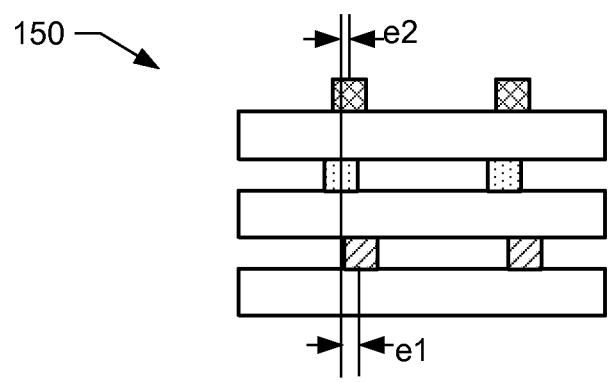
FIGS. 2 and 3 illustrate structures with a number of periodic patterns and a plurality of overlay errors to be simultaneously measured.
Figure 3:
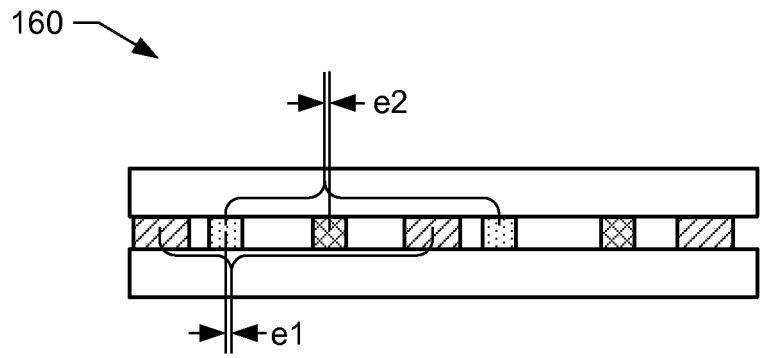

FIG. 1 illustrates a structure 100 with multiple overlay errors. The structure 100 shown in FIG. 1 includes three separate patterns 102, 104, and 106, where patterns 102 and 104 are interwoven on a first layer 108 and pattern 106 is on a separate layer 110. In FIG. 1, pattern 104 is misaligned with its desired position with respect to the pattern 102 by an overlay error e1, where the desired position of pattern 104 is at one half of the pitch of pattern 102 as illustrated by the bracket 103. Additionally, pattern 106 is misaligned with its desired position with respect to the pattern 104 by an overlay error e2, where the desired position of pattern 106 is directly over pattern 104. Of course, the structure 100 that is under test may have different configurations, including additional patterns, alternative positions of the patterns, more or fewer layers, or a combination of the above as illustrated by structures 150 and 160 in FIGS. 2 and 3, respectively.

Diffraction based overlay (DBO) metrology is based on the measurement of the diffraction of light from a number of alignment pads. As disclosed herein, a DBO target is produced for simultaneous measurement of multiple (n) overlay errors, where $n \geq 2$, in a structure under test that includes m periodic patterns, where $m = n+1$. The DBO target uses a plurality of diffraction based overlay pads, each of which includes the same number periodic patterns as the structure under test. The pads include a programmed shift, i.e., an intentional shift from the intended position, between each of the three or more periodic patterns.

Figure 4:
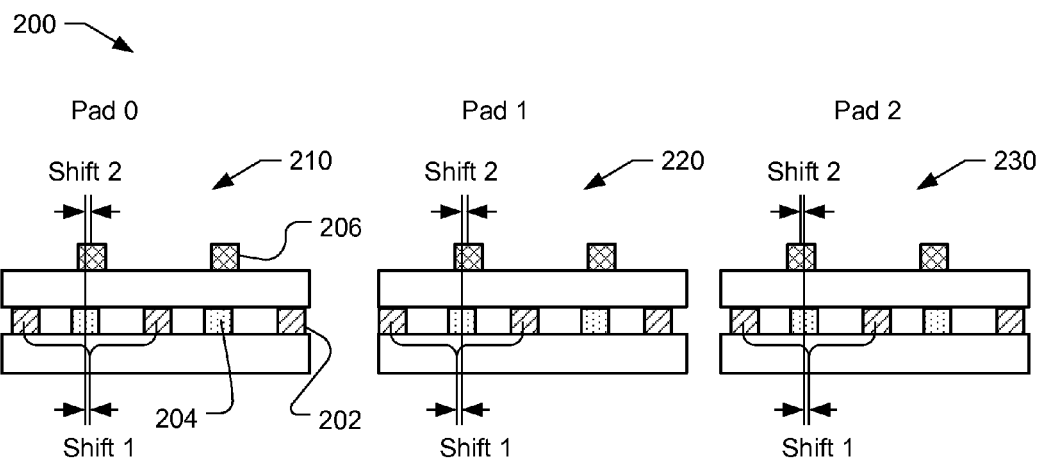
FIG. 4 illustrates a diffraction based overlay target with a number of diffraction based overlay pads, each having the same number of periodic patterns as the structure under test and a programmed shift between each pair of periodic patterns.

FIG. 4 illustrates a DBO target 200 for the structure 100 under test. As illustrated, target 200 includes three diffraction based overlay pads 210, 220, and 230, respectively labeled Pad 0, Pad 1, and Pad 2. The minimum possible number of pads included in the target 200 is n+1. Using the minimum number of pads is advantageous to reduce the overall size of the target 200. Each of the pads includes m periodic patterns 202, 204, and 206, which correspond to the periodic patterns 102, 104, and 106, in the structure 100 under test shown in FIG. 1, except for the inclusion of a programmed shift. As illustrated in FIG. 4, each pad 210, 220, and 230 includes a first total shift (Shift 1) between the periodic patterns 202 and 204, and a second total shift (Shift 2) between the periodic patterns 204 and 206, where the total shift is the sum of the programmed shift and the overlay error. In one embodiment, the programmed shifts used in the pads may be small compared to the pitch of the periodic patterns, e.g., 5% or less, and may be conveniently chosen to be equal in magnitude and opposite in direction. For example, Shift 1 may include programmed shifts of +d1 and −d1, while Shift 2 may include programmed shifts of +d2 and −d2. For example, the pads are designed with the total shifts described in Table 1 below.

TABLE 1

|  | Shift 1 | Shift 2 |
| --- | --- | --- |
| Pad 0 | d1 + e1 | d2 + e2 |
| Pad 1 | −d1 + e1 | d2 + e2 |
| Pad 2 | d1 + e1 | −d2 + e2 |

The use of equal and opposite programmed shifts simplifies the mathematics and thus will be addressed herein. However, other programmed shifts, i.e., different magnitudes and/or directions may be used if desired and are mathematically equivalent. Moreover, if desired, some pads may include a programming shift with zero magnitude. The overlay error in the alignment between the periodic patterns produces changes in the resulting diffracted light. Using the number of alignment pads and the resulting diffraction signal from each alignment pad, the multiple overlay errors can be determined simultaneously.

Figure 5:
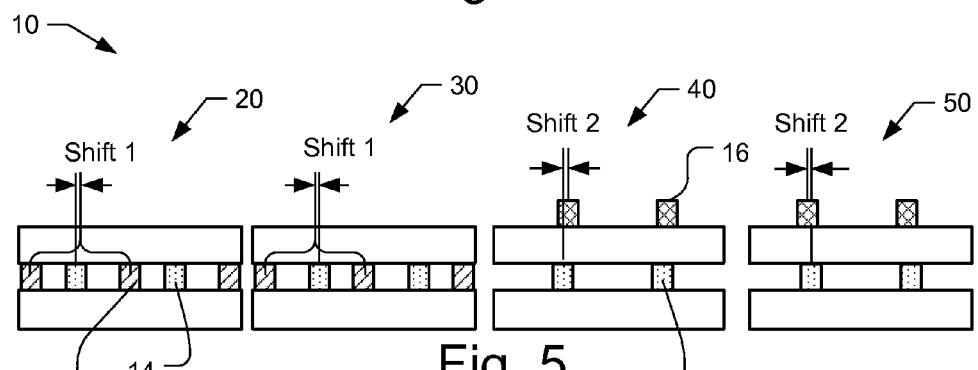
FIG. 5 illustrates a conventional DBO target for a structure that has multiple overlay errors.

By way of comparison, FIG. 5 illustrates a conventional DBO target 10 for a structure that has multiple overlay errors, such as structure 100. In a conventional system, the overlay errors are determined separately and thus, a minimum of two overlay pads are used for each overlay error to be measured, i.e., the minimum possible number of pads for a conventional target is 2n. Thus, as shown in FIG. 5, DBO target 10 includes four pads 20, 30, 40, and 50. Each of the pads includes a subset of the periodic patterns found in the structure 100 under test. For example, pads 20 and 30 include periodic patterns 12 and 14 (which correspond to periodic patterns 102 and 104 in structure 100), while pads 40 and 50 include periodic patterns 14 and 16 (which correspond to periodic patterns 104 and 106 in structure 100). Thus, the conventional DBO target 10 includes 2×n pads resulting in a much larger footprint than DBO target 200 shown in FIG. 4 and requires separate processing to determine the individual overlay errors.

Referring back to FIG. 4 and DBO target 200, the overlay errors e1 and e2 may be extracted by a set of linear equations to simultaneously solve for the overlay errors e1 and e2. In one embodiment, the cross-polarization terms of the Mueller matrix may be used. The Mueller matrix M is a 4×4 matrix that describes the sample being measured and is related to the Jones matrix J as follows:

$$M = TJ \otimes J^* T^{-1} \qquad \text{eq. 1}$$

The Jones matrix describes the sample-light interaction as follows:

$$J = \begin{pmatrix} r_{ss} & r_{sp} \\ r_{ps} & r_{pp} \end{pmatrix} \qquad \text{eq. 2}$$

$$\begin{pmatrix} E'_s \\ E'_p \end{pmatrix} = \begin{pmatrix} r_{ss} & r_{sp} \\ r_{ps} & r_{pp} \end{pmatrix} \begin{pmatrix} E_s \\ E_p \end{pmatrix}. \qquad \text{eq. 3}$$

The Jones matrix depends on the angle of incidence, azimuth, wavelength as well as structural details of the sample. The diagonal elements describe the complex reflectance (amplitude & phase) for polarization orthogonal ($r_{ss}$) and parallel ($r_{pp}$) to the plane incidence defined by the illumination and collection arms. The off-diagonal terms $r_{sp}$ and $r_{ps}$ are related to polarization conversion between s and p polarization states in the presence of sample anisotropy. The Jones matrix J elements, however, are not easily obtained experimentally. The elements of the 4×4 Mueller matrix M, however, can be derived experimentally.

The matrix T in equation 1 is used to construct the 4×4 Mueller matrix from the Jones matrix and is given by:

$$T = \begin{pmatrix} 1 & 0 & 0 & 1 \\ 1 & 0 & 0 & -1 \\ 0 & 1 & 1 & 0 \\ 0 & i & -i & 0 \end{pmatrix}. \qquad \text{eq. 4}$$

The Mueller matrix is measured by, e.g., an ellipsometer, such as that described in FIG. 6 below, and the Jones matrix is calculated from first principles for a given sample. So to compare the theoretical calculation to the experimental data one needs to convert the Jones matrix to Mueller matrix.

The Mueller matrix M may be written in the Stokes formalism as follows:

$$\begin{pmatrix} s_0 \\ s_1 \\ s_2 \\ s_3 \end{pmatrix}^{out} = \begin{pmatrix} m_{11} & m_{12} & m_{13} & m_{14} \\ m_{21} & m_{22} & m_{23} & m_{24} \\ m_{31} & m_{32} & m_{33} & m_{34} \\ m_{41} & m_{42} & m_{43} & m_{44} \end{pmatrix} \begin{pmatrix} s_0 \\ s_1 \\ s_2 \\ s_3 \end{pmatrix}^{in}. \qquad \text{eq. 5}$$

The Stokes vector S is described as follows:

$$S = \begin{pmatrix} s_0 \\ s_1 \\ s_2 \\ s_3 \end{pmatrix} = \begin{pmatrix} |E_s|^2 + |E_p|^2 \\ |E_s|^2 - |E_p|^2 \\ 2\operatorname{Re}(E_s E_p^*) \\ 2\operatorname{Im}(E_s E_p^*) \end{pmatrix} = \begin{pmatrix} \text{total power } P \\ P_{0°} - P_{90°} \\ P_{45°} - P_{-45°} \\ P_{RHC} - P_{LHC} \end{pmatrix}. \qquad \text{eq. 6}$$

Not all of the elements of the Mueller matrix M are required. For example, the cross-polarization terms, i.e., the off-diagonal block spectra may be used. The off-diagonal block spectra may be described as follows, where x1 is the total Shift 1 and x2 is the total Shift 2:

$$PAD0: M0 = \qquad \text{eq. 7}$$
$$M(d1 + e1, d2 + e2) \approx \frac{\partial M}{\partial x1}(d1 + e1) + \frac{\partial M}{\partial x2}(d2 + e2);$$

-continued $$PAD1: M1 =$$  eq. 8
$$M(-d1+e1, d2+e2) \approx \frac{\partial M}{\partial x1}(-d1+e1) + \frac{\partial M}{\partial x2}(d2+e2);$$

$$PAD2: M2 =$$  eq. 9
$$M(d1+e1, -d2+e2) \approx \frac{\partial M}{\partial x1}(d1+e1) + \frac{\partial M}{\partial x2}(-d2+e2);$$

The differential signal between Pad 0 and Pad 1 is thus:

$$ref_1 = M0 - M1 = 2d1\frac{\partial M}{\partial x1}.$$  eq. 10

Similarly, the differential signal between Pad 0 and Pad 2 is thus:

$$ref_2 = M0 - M2 = 2d2\frac{\partial M}{\partial x2}.$$  eq. 11

By inserting equations 10 and 11 into equation 7, the following is achieved:

$$M0 = \sum_{i=1,2} \frac{ref_i}{2d_i}(d_i + e_i) = \sum_{i=1,2} \frac{ref_i}{2} + \sum_{i=1,2} \frac{ref_i}{2d_i} e_i.$$  eq. 12

A composite overlay signal may be defined as:

$$sig = M0 - \sum_{i=1,2} \frac{ref_i}{2} = \sum_{i=1,2} \frac{ref_i}{2d_i} e_i$$  eq. 13

To extract e1 and e2, merit functions of the left hand side and right hand side of equation 13 are defined as:

$$MF = \sum_{\lambda j} \left( sig(\lambda j) - \sum_{i=1,2} \frac{ref_i(\lambda j)}{2d_i} e_i \right)^2$$  eq. 14

Using equation 14, the derivative with respect to overlay error e1 is:

$$\frac{\partial MF}{\partial e1} = 0 \Rightarrow sig \cdot ref_1 - \frac{ref_1 \cdot ref_1}{2d1} e1 - \frac{ref_2 \cdot ref_1}{2d2} e2 = 0$$  eq. 15 where · stands for dot product of two vectors and is defined as:

$$S \cdot T = \Sigma_{\lambda j}(S(\lambda j) \times T(\lambda j)).$$  eq. 16 where S, T are sig, $ref_1$ or $ref_2$.
Similarly, the derivative with respect to overlay error e2 is:

$$\frac{\partial MF}{\partial e2} = 0 \Rightarrow sig \cdot ref_2 - \frac{ref_1 \cdot ref_2}{2d1} e1 - \frac{ref_2 \cdot ref_2}{2d2} e2 = 0$$  eq. 17

Solving equations 15 and 17, results in the following:

$$\begin{pmatrix} e1 \\ e2 \end{pmatrix} = A^{-1}b \text{ where}$$  eq. 18

$$A = \begin{pmatrix} ref_1 \cdot ref_1/2d_1 & ref_1 \cdot ref_2/2d_2 \\ ref_2 \cdot ref_1/2d_1 & ref_2 \cdot ref_2/2d_2 \end{pmatrix}; \text{ and}$$  eq. 19

$$b = \begin{pmatrix} sig \cdot ref_1 \\ sig \cdot ref_2 \end{pmatrix}$$

In general, the spectral signal should have a linear response to each of the overlay errors, and the spectral responses are additive. Moreover, to extract e1 and e2 accurately, they should not be strongly correlated, i.e., $ref_1$ and $ref_2$ should have different spectral shapes. For the Mueller matrix, the above is generally met with appropriate selection of wavelengths and d1 and d2.

It should be understood that the above use of the Muller matrix to simultaneously determine multiple overlay errors may be extended to any n overlay errors, where n+1 pads are used for each direction and d1 through do are programmed shifts that are small compared to the pitch and may be conveniently chosen to be equal. For example, a DBO target including n+1 pads may be configured as described in Table 2 below.

TABLE 2

|  | Shift 1 | Shift 2 | ... | Shift n |
|---|---|---|---|---|
| Pad 0 | d1 + e1 | d2 + e2 | | dn + en |
| Pad 1 | −d1 + e1 | d2 + e2 | | dn + en |
| Pad 2 | d1 + e1 | −d2 + e2 | | dn + en |
| ... | ... | ... | ... | ... |
| Pad n | d1 + e1 | d2 + e2 | | −dn + en |

Accordingly, n differential signals can be generated, similar to equations 10 and 11 above, which may be generally written as:

$$ref_1 = M0 - Mi = 2di\frac{\partial M}{\partial xi}.$$  eq. 20 where i=0 to n. The composite overlay signal sig from equation 13 can generally be written as:

$$sig = M0 - \sum_i \frac{ref_i}{2} = \sum_i \frac{ref_i}{2d_i} e_i$$  eq. 21

The n overlay errors e1 through en can be written as:

$$\begin{pmatrix} e_1 \\ \dots \\ e_n \end{pmatrix} = A^{-1}b$$  eq. 22

Where A is an n×n matrix and its element $A_{ij}$ is given by:
$$A_{ij} = ref_i \cdot ref_j/2d_j$$  eq. 23a And b is a vector of n elements, with each element given by:
$$b_i = sig \cdot ref_i.$$  eq. 23b The measurement of the spectra from the pads of the DBO target 200 may be performed using a reflectometer, ellipsometer, scatterometer or any other appropriate instrument. By way of example, FIG. 6 illustrates an ellipsometer 300 that may be used to perform the simultaneous measurement of multiple overlay errors on a sample 301 based on at least a portion of the Mueller matrix. The sample 301 includes an overlay pattern, such as DBO target 200 to be measured. Sample 301 may be, e.g., a semiconductor wafer or flat panel display or any other substrate, and is supported by a stage 303, which may be a polar coordinate, i.e., R-θ, stage or an x-y translation stage.

Ellipsometer 300 is a rotating compensator ellipsometer 300 that performs a diffraction based measurement on the sample 301. The ellipsometer 300 includes a polarization state generator (PSG) 302 and a polarization state detector (PSD) 312. The PSG 302 produces light having a known polarization state and is illustrated as including two broadband light sources 304 and 306, e.g., a Xenon Arc lamp and a Deuterium lamp, respectively, to produce light with a range of 200-3100 nm. A beam splitter 308 combine the light from the light sources 304, 306 and a polarizer 310 produces the known polarization state. It should be understood that additional, different, or fewer light sources may be used if desired. Moreover, if desired, ellipsometer 300 may be monochromatic, with a variable angle of incidence to provide angle resolved measurements.

The PSD 312 includes a polarizing element, referred to as an analyzer 314, a spectrometer 316 and a detector 318, which may be, e.g., a cooled CCD array. The analyzer 314 is illustrated as being coupled to the spectrometer 316 and detector 318 via a fiber optic cable 320. It should be understood that other arrangements are possible, such as directly illuminating the spectrometer 316 from the analyzer 314 without the fiber optic cable 320.

The ellipsometer 300 is illustrated with two rotating compensators 322 and 324 between the PSG 302 and PSD 312. If desired, the ellipsometer 300 may use a single rotating compensator 322 or 324, e.g., between the PSG 302 and the sample 301 or between the sample 301 and the PSD 312, respectively. The ellipsometer 300 may further include focusing elements 326 and 328 before and after the sample 301, as illustrated in FIG. 6. The focusing elements may be, e.g., refractive or reflective lenses.

The ellipsometer 300 obliquely illuminates the sample 301, e.g., at a non-zero value of A with respect to surface normal 301 normal. For example, the ellipsometer 300 may illuminate the sample 301 at an angle between 50° to 85°, for example at 65°, but other angles may be used if desired. As discussed above, if monochromatic light is used, the angle of incidence may be varied to derive an angle resolved measurement. By way of example, the ellipsometer may be a M2000 ellipsometer produced by JA Woollam Co., Inc.

Figure 6:
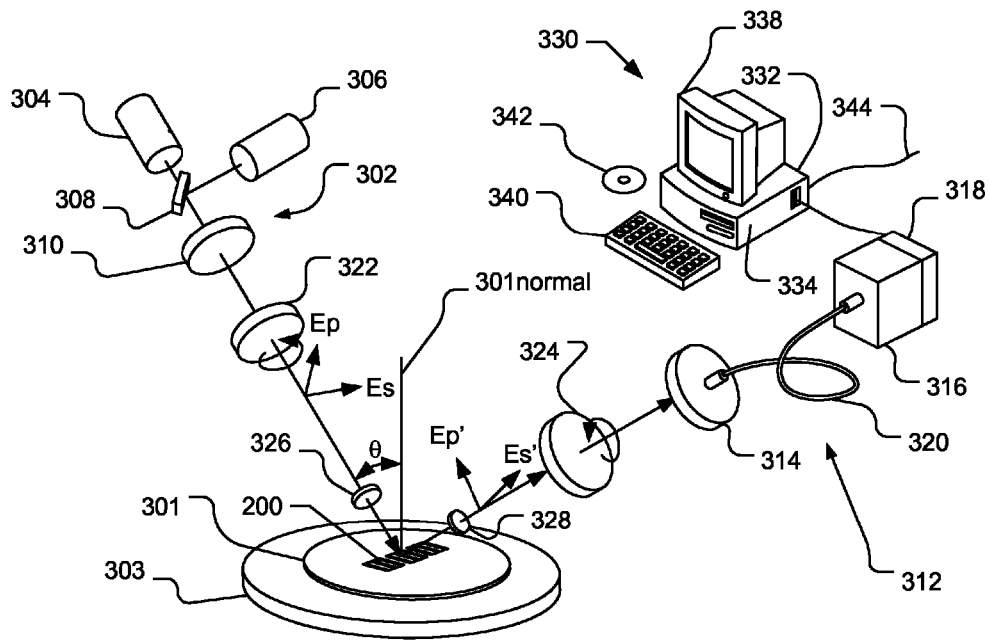
FIG. 6 illustrates an ellipsometer that may be used to perform the simultaneous measurement of multiple overlay errors on a sample based on at least a portion of the Mueller matrix.

As illustrated in FIG. 6, the detector 318 is coupled to a computer 330, which includes a processor 332 with memory 334, as well as a user interface including e.g., a display 338 and input devices 340. A non-transitory computer-usable medium 342 having computer-readable program code embodied may be used by the computer 330 for causing the processor to control the device 300 and to perform the functions including the analysis described herein. The data structures and software code for automatically implementing one or more acts described in this detailed description can be implemented by one of ordinary skill in the art in light of the present disclosure and stored, e.g., on a computer readable storage medium 342, which may be any device or medium that can store code and/or data for use by a computer system such as processor 332. The non-transitory computer-usable medium 342 may be, but is not limited to, magnetic and optical storage devices such as disk drives, magnetic tape, compact discs, and DVDs (digital versatile discs or digital video discs). A communication port 344 may also be used to receive instructions that are used to program the computer 330 to perform any one or more of the functions described herein and may represent any type of communication connection, such as to the internet or any other computer network. Additionally, the functions described herein may be embodied in whole or in part within the circuitry of an application specific integrated circuit (ASIC) or a programmable logic device (PLD), and the functions may be embodied in a computer understandable descriptor language which may be used to create an ASIC or PLD that operates as herein described.

Ellipsometry typically examines the changes in the p- and s-components of light caused by reflection or transmission from a sample. For example, light having a known polarization state from the PSG 302 is produced and incident on the sample and the resulting change in the polarization state is measured by the PSD 312. The change in polarization state is typically written as follows:

$$R_p = \frac{E'_p}{E_p}; R_s = \frac{E'_s}{E_s}. \qquad \text{eq. 24}$$

In equation 24, $E_p$ and $E_s$ are the electrical vectors for the respective parallel and perpendicular components of the elliptically polarized incident light and $E'_p$ and $E'_s$ are the parallel and perpendicular components, respectively, of the elliptically polarized reflected light, and $R_p$ and $R_s$ are the reflection coefficients of the sample for the parallel and perpendicular components of light. The ellipsometric sample parameters ψ and Δ are then conventionally determined as follows:

$$\frac{R_p}{R_s} = \tan\psi e^{i\Delta}. \qquad \text{eq. 25}$$

Using at least the off-diagonal elements from the Mueller matrix produced by ellipsometer 300, the multiple overlay errors may be simultaneously determined as discussed above.

Figure 7:
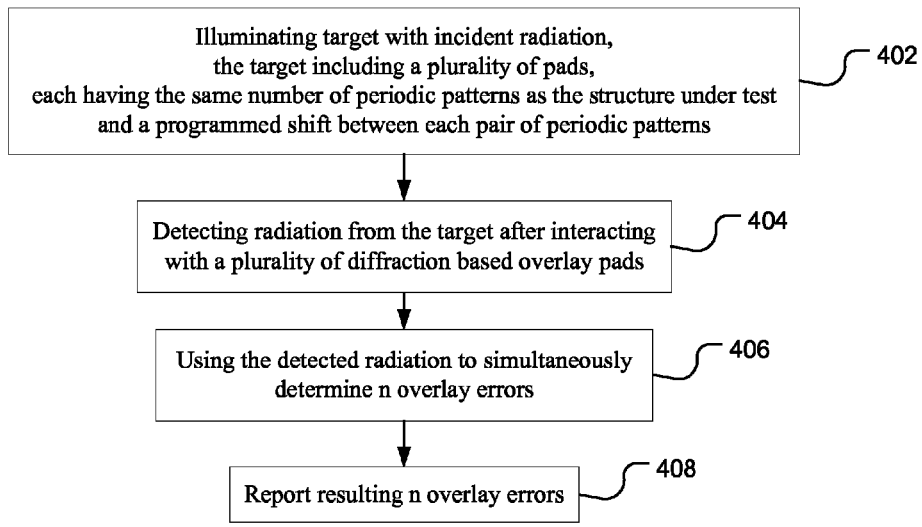
FIG. 7 is a flow chart of the process of simultaneously measuring n overlay errors in a structure under test that includes m periodic patterns, where $n \geq 2$ and $m = n+1$.

FIG. 7 is a flow chart of the process of simultaneously measuring n overlay errors in a structure under test that includes m periodic patterns, where n≥2 and m=n+1. A target is illuminated with incident radiation (402). The target includes a plurality of diffraction based overlay pads, each of which includes the same number of periodic patterns as the structure under test and wherein each diffraction based overlay pad includes a programmed shift between each pair of periodic patterns. The radiation is detected after interacting with the plurality of diffraction based overlay pads (404). The detected radiation from each of the plurality of diffraction based overlay pads is used to simultaneously determine the n overlay errors based on the programmed shifts (406). The resulting measurement of the multiple overlay errors is then reported (408), e.g., by storing in memory 334 (FIG. 6), displaying on display 338 or otherwise recording. Determining the n overlay errors using the detected radiation in step 404 may be performed using the Mueller matrix as described above.

Figure 8:
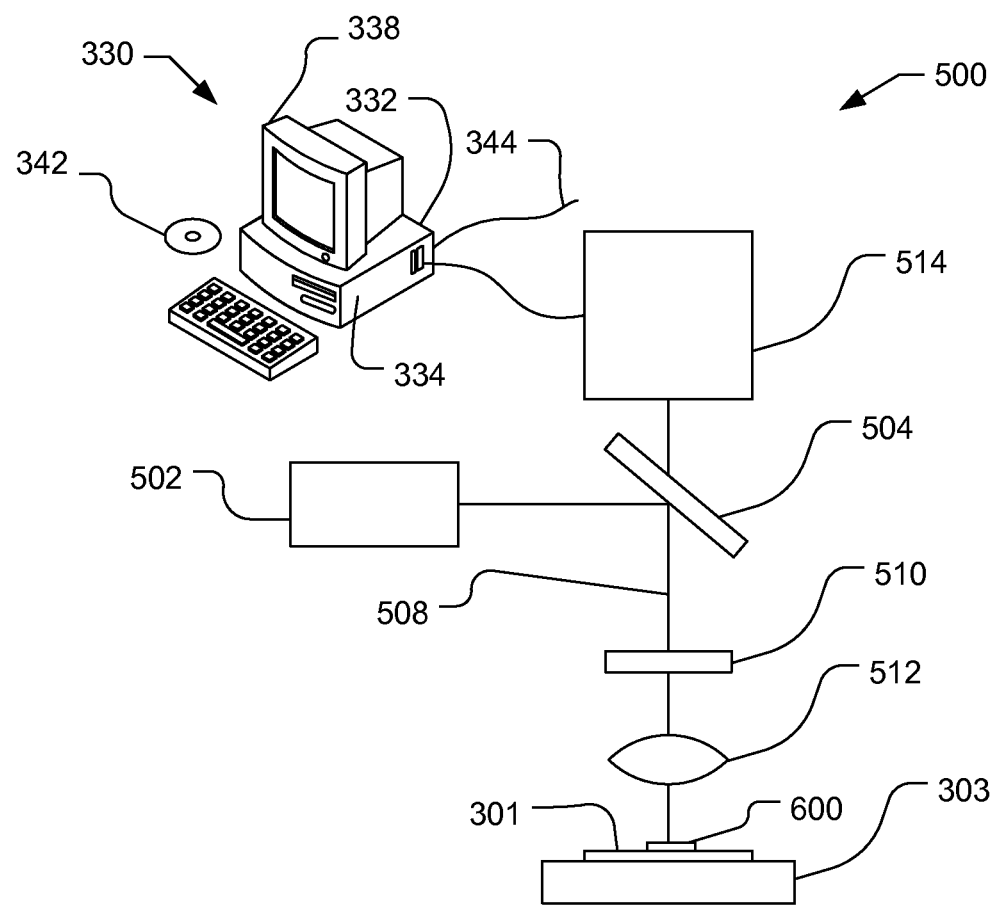
FIG. 8 illustrates a normal incidence polarized reflectance spectrometer that may be used to perform the simultaneous measurement of multiple overlay errors on a sample.

Alternatively, normal incidence reflectometry may be used to determine the n overlay errors. FIG. 8 illustrates a normal incidence polarized reflectance spectrometer 500 that may be used to measure the sample 301 on stage 303. Spectrometer 500 is discussed in detail in the U.S. Pat. No. 7,115,858, which is incorporated herein by reference.

As shown in FIG. 8, spectrometer 500 is similar to a reflectometer, which is well known in the art. Spectrometer 500 includes a polychromatic light source 502 that generates a light beam that is partially reflected by beam splitter 504 along the optical axis 508. The light beam is directed towards a sample 301 having the target 600 to be measured. Sample 301 is supported by a stage 303, which may be a polar coordinate, i.e., R-θ, stage or an x-y translation stage. Spectrometer 500 may include a rotatable polarizer 510 and a lens 512 (or series of lenses) to polarize and focus the light beam onto the sample 301 at normal incidence. The beam is reflected off sample 301 and the reflected light is transmitted through lens 512 and polarizer 510. A portion of the reflected light is transmitted through beam splitter 504 and is received by a spectrophotometer 514. Spectrophotometer 514 is coupled to the computer 330, which analyzes the data provided by spectrophotometer 514. Computer 330 may be the same as computer 330 described above.

Figure 9:
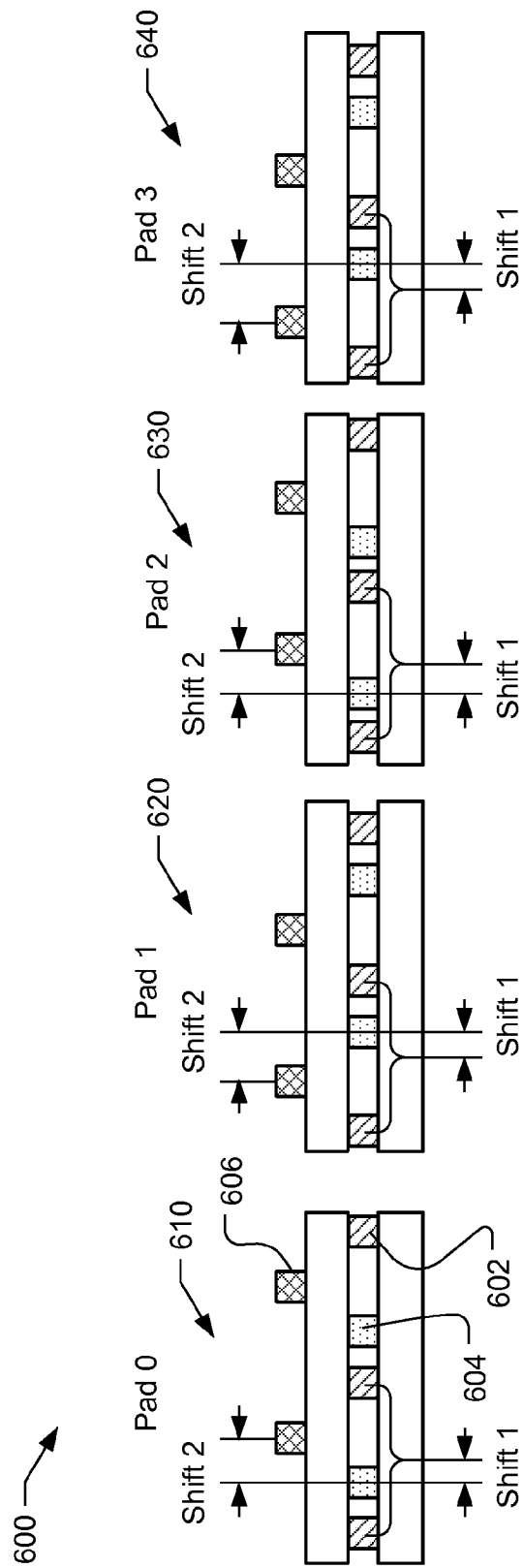
FIG. 9 illustrates a diffraction based overlay target with a number of diffraction based overlay pads, each having the same number of periodic patterns as the structure under test and a programmed shift between each pair of periodic patterns and to be measured by a reflectometer.

FIG. 9 illustrates a DBO target 600 that may be used with a normal incidence metrology device, such as spectrometer 500 shown in FIG. 8, to measure a structure under test, such as structure 100 shown in FIG. 1. As illustrated in FIG. 9, target 600 includes four diffraction based overlay pads 610, 620, 630, and 640, respectively labeled Pad 0, Pad 1, Pad 2, and Pad 3. The minimum possible number of pads included in the target 600 is n+2. A conventional target for use with a normal incidence metrology device, on the other hand, requires a minimum of three overlay pads for each overlay error to be measured, i.e., the minimum possible number of pads for a conventional target is 3n. Using the minimum number of pads is advantageous to reduce the overall size of the target 600. Each of the pads includes m periodic patterns 602, 604, and 606, which correspond to the periodic patterns 102, 104, and 106, in the structure 100 under test shown in FIG. 1, except for the inclusion of a programmed shift. As illustrated in FIG. 9, each pad 610, 620, 630 and 640 includes a first total shift (Shift 1) between the periodic patterns 602 and 604, and a second total shift (Shift 2) between the periodic patterns 604 and 606, where the total shift is the sum of the programmed shift and the overlay error. The programmed shift in DBO target 600 may include two components: a first component of ±D1 and ±D2 may be approximately ¼ of the pitch between periodic patterns and a second component ±d1 and ±d2 may be small compared to the pitch, e.g., 5%, and may be conveniently chosen to be equal. For example, Shift 1 and Shift 2 for the pads may be designed as described in Table 3 below.

TABLE 3

|  | Shift 1 | Shift 2 |
| --- | --- | --- |
| Pad 0 | D1 + e1 | D2 + e2 |
| Pad 1 | −D1 + e1 | −D2 + e2 |
| Pad 2 | D1 + d1 + e1 | D2 + e2 |
| Pad 3 | −D1 + e1 | −D2 − d2 + e2 |

Of course, other programmed shifts may be used if desired. Using the number of alignment pads and the resulting diffraction signal from each alignment pad, the multiple overlay errors can be determined.

Using the TE, TM spectra detected from the pads, where x1 is the total Shift 1 and x2 is the total Shift 2:

$$PAD0: R1=R(D1+e1,D2+e2);\quad\text{eq. 26}$$

$$PAD1: R1=R(D1-e1,D2-e2);\quad\text{eq. 27}$$

$$PAD 2: R2=R(D1+d1+e1,D2+e2)\quad\text{eq. 28}$$

$$PAD3: R3=R(D1-e1,D2+d2-e2)\quad\text{eq. 29}$$

The differential signal between Pad 0 and Pad 1 is thus:

$$sig = R0 - R1 = 2e1\frac{\partial R}{\partial x1} + 2e2\frac{\partial R}{\partial x2}.\quad\text{eq. 30}$$

The differential signal between Pad 0 and Pad 2 is thus:

$$ref_1 = R2 - R0 = d1\frac{\partial R}{\partial x1},\quad\text{eq. 31}$$

The differential signal between Pad 1 and Pad 3 is thus:

$$ref_2 = R3 - R1 = d2\frac{\partial R}{\partial x2}.\quad\text{eq. 32}$$

By inserting equations 31 and 32 into equation 30, the following is achieved:

$$sig = ref_1\frac{2e1}{d1} + ref_2\frac{2e2}{d2}.\quad\text{eq. 33}$$

To extract e1 and e2, merit function is defined as:

$$MF = \sum_{\lambda j}\left(sig(\lambda j) - \sum_{i=1,2}\frac{ref_i(\lambda j)}{d_i}2e_i\right)^2\quad\text{eq. 34}$$

The derivative with respect to overlay error e1 is:

$$\frac{\partial MF}{\partial e1} = 0 \Rightarrow sig \cdot ref_1 - \frac{ref_1 \cdot ref_1}{d1}2e1 - \frac{ref_2 \cdot ref_1}{d2}2e2 = 0\quad\text{eq. 35}$$

where · stands for dot product of two vectors and is defined as:

$$S \cdot T = \Sigma_{\lambda j}(S(\lambda j) \times T(\lambda j)).\quad\text{eq. 36}$$

where S, T are sig, $ref_1$ or $ref_2$.

Similarly, the derivative with respect to overlay error e2 is:

$$\frac{\partial MF}{\partial e2} = 0 \Rightarrow sig \cdot ref_2 - \frac{ref_1 \cdot ref_2}{d1}2e1 - \frac{ref_2 \cdot ref_2}{d2}2e2 = 0\quad\text{eq. 37}$$

Solving equations 35 and 37, results in the following:

$$\begin{pmatrix}e1\\e2\end{pmatrix} = A^{-1}b \text{ where}\quad\text{eq. 38}$$

$$A = \begin{pmatrix}2ref_1 \cdot ref_1/d_1 & 2ref_1 \cdot ref_2/d_2\\2ref_2 \cdot ref_1/d_1 & 2ref_2 \cdot ref_2/d_2\end{pmatrix}; \text{ and}\quad\text{eq. 39}$$

$$b = \begin{pmatrix}sig \cdot ref_1\\sig \cdot ref_2\end{pmatrix}$$

In general, the spectral signal should have a linear response to each of the overlay errors, and the spectral responses are additive. Moreover, to extract e1 and e2 accurately, they should not be strongly correlated, i.e., $ref_1$ and $ref_2$ should have different spectral shapes. For the normal incidence reflectance, the above is generally met with appropriate selection of wavelengths and d1 and d2.

Figure 10A:
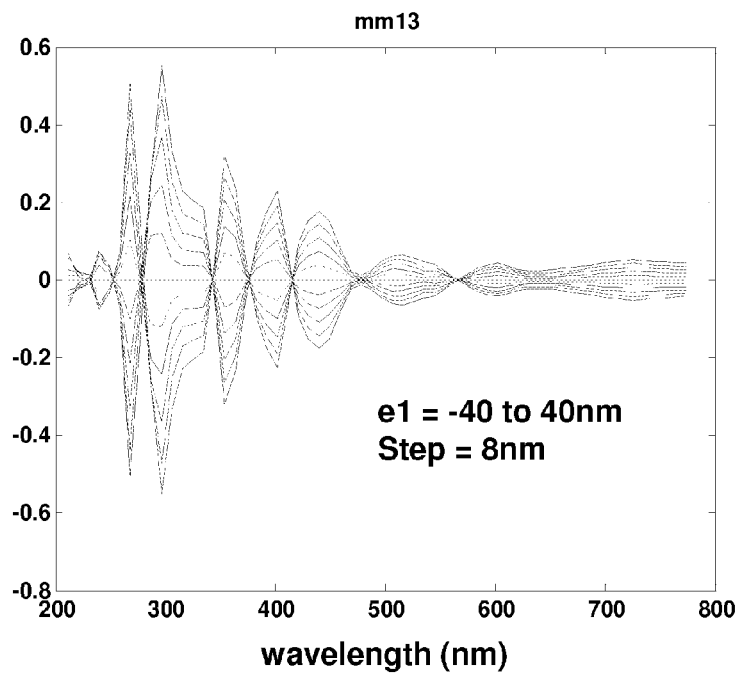
FIGS. 10A, 10B illustrate the linearity of the Mueller response to an overlay error e1 in the structure shown in FIG. 1.
Figure 10B:
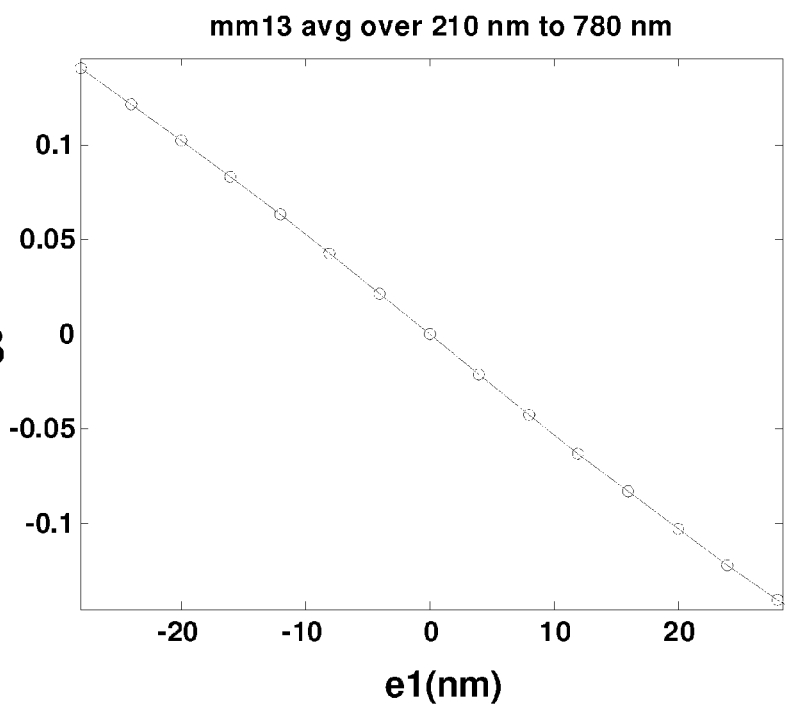
Figure 11A:
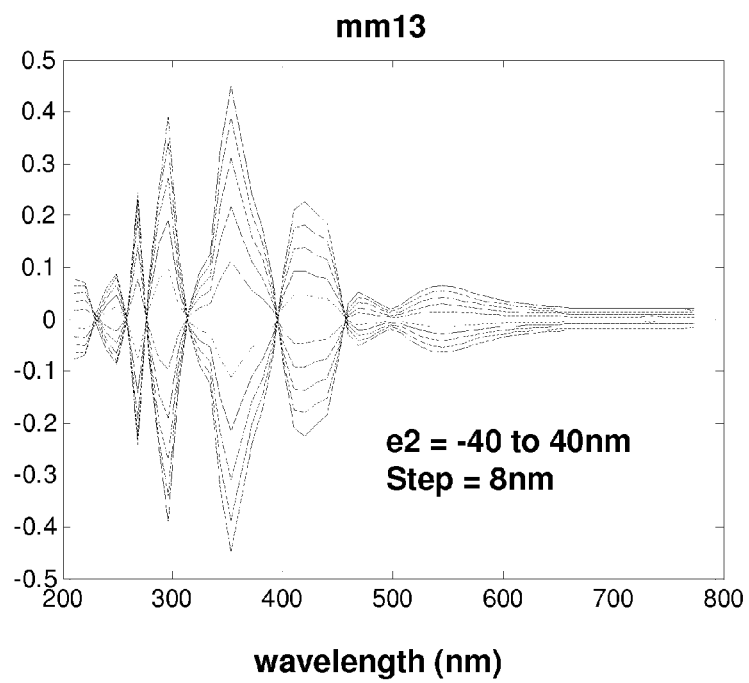
FIGS. 11A, 11B illustrate the linearity of the Mueller response to an overlay error e2 in the structure shown in FIG. 1.
Figure 11B:
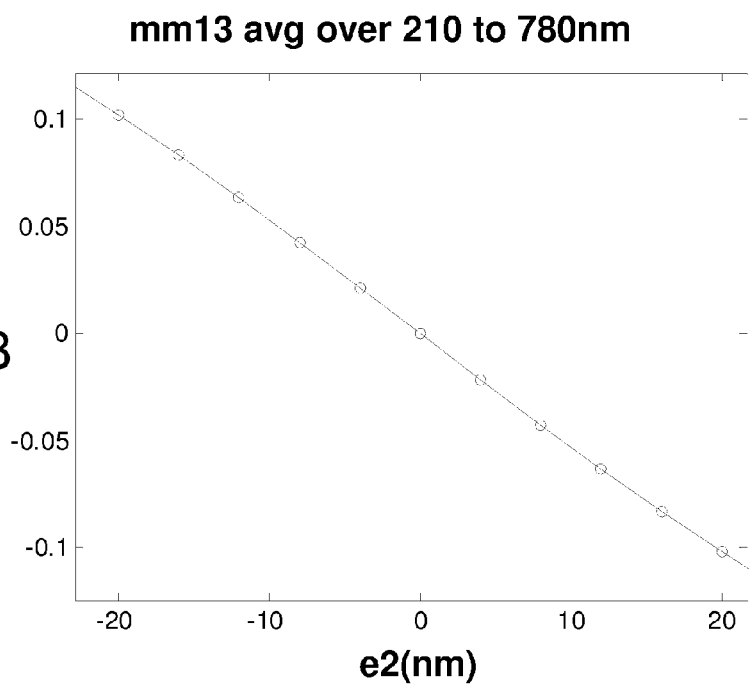
Figure 10C:
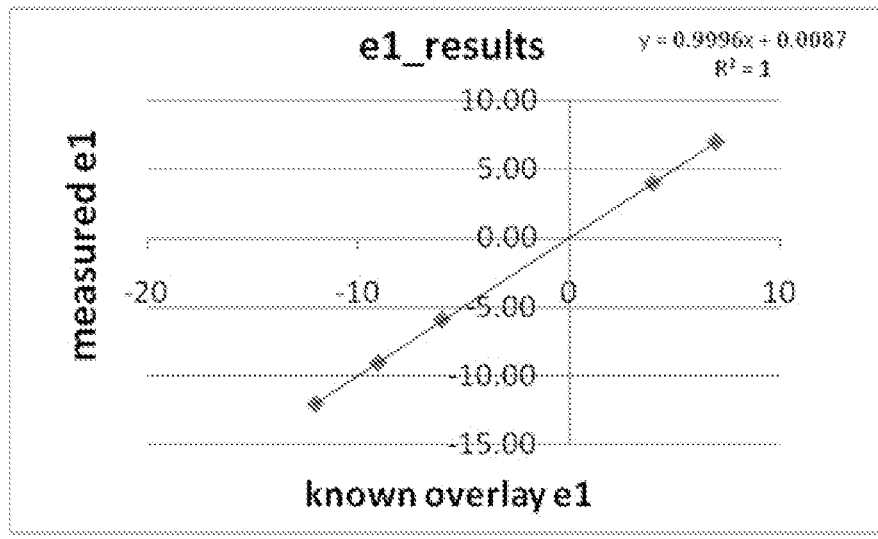
FIG. 10C illustrates the correlation of the known overlay error e1 to the measured overlay error.
Figure 11C:
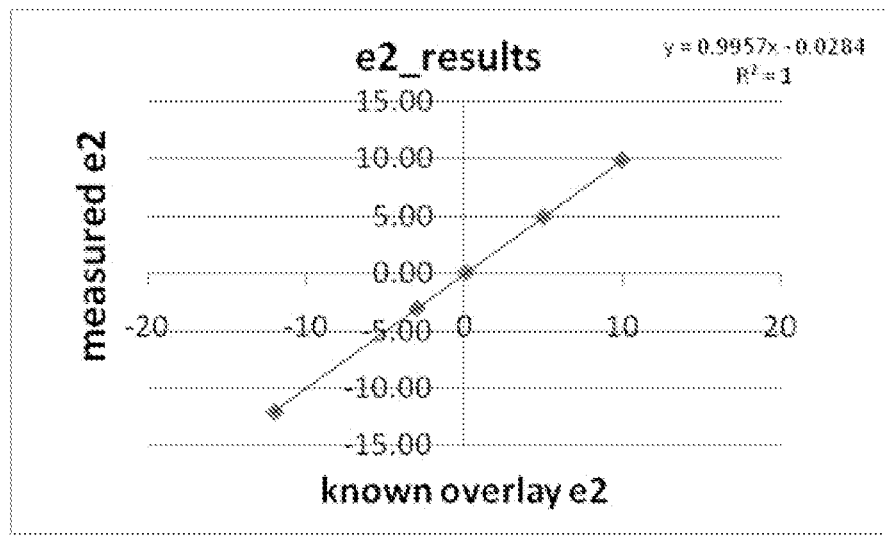
FIG. 11C illustrates the correlation of the known overlay error e2 to the measured overlay error.

FIGS. 10A, 10B illustrate the linearity of the Mueller response to an overlay error e1 in the structure shown in FIG. 1, with FIG. 10A illustrating the spectrum of Mueller Matrix element mm13, and FIG. 10B illustrating the averaged intensity over wavelengths 210 nm to 780 nm with respect to the overlay error e1. FIG. 10C illustrates the correlation of the known overlay error e1 to the measured overlay error. FIGS. 11A, 11B similarly illustrate the linearity of the Mueller response to an overlay error e2 in the structure shown in FIG. 1, with FIG. 11A illustrating the spectrum of Mueller Matrix element mm13, and FIG. 11B illustrating the averaged intensity over wavelengths 210 nm to 780 nm with respect to the overlay error e2. As can be seen, the spectral response to e2 (FIG. 11A) has a different shape than the spectral response to e1 (FIG. 10A), which allows separation of the e1 signal from the e2 signal so that e1 and e2 may be measured simultaneously. FIG. 11C illustrates the correlation of the known overlay error e2 to the measured overlay error.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A method of simultaneously measuring n overlay errors in a structure, the method comprising:
   illuminating a target with incident radiation, the target having a plurality of diffraction based overlay pads, each diffraction based overlay pad having a number m of periodic patterns, where n≥2 and m=n+1, wherein the target comprises:
      a first diffraction based overlay pad having a programmed shift between each pair of periodic patterns in the number m of periodic patterns; and
      each remaining diffraction based overlay pad having a same programmed shift for each pair of periodic patterns as a corresponding pair of periodic patterns in the first diffraction based overlay pad except for only one pair of periodic patterns that has a different programmed shift than the corresponding pair of periodic patterns in the first diffraction based overlay pad, wherein for each of the one pair of periodic patterns that has the different programmed shift the different programmed shift is a different value and each of the one pair of periodic patterns that has the different programmed shift corresponds to a different pair of periodic patterns in the first diffraction based overlay pad;
   detecting radiation from the target after the incident radiation interacts with the plurality of diffraction based pads; and
   using differential signals from the detected radiation from different pairs of the plurality of diffraction based overlay pads to simultaneously determine the n overlay errors based on the programmed shift between each pair of periodic patterns.

2. The method of claim 1, wherein a magnitude of each of the programmed shifts in the first diffraction based overlay pad is non-zero.

3. The method of claim 1, wherein at least two of the periodic patterns in each diffraction based overlay pad is on a same layer.

4. The method of claim 1, wherein each of the periodic patterns in each diffraction based overlay pad is on a different layer.

5. The method of claim 1, wherein the diffraction based overlay pads have the same physical configuration as the structure except for the programmed shift between each pair of periodic patterns.

6. The method of claim 1, wherein illuminating the target and detecting radiation is performed using an ellipsometer.

7. The method of claim 1, wherein using the differential signals from the detected radiation comprises using Mueller matrices.

8. The method of claim 7, wherein a subset of elements from the Mueller matrices are used.

9. An alignment target for simultaneously determining n overlay errors in a structure, the alignment target comprising a plurality of diffraction based overlay pads, each diffraction based overlay pad having a number m of periodic patterns, where n≥2 and m=n+1, and wherein the alignment target comprises:
   a first diffraction based overlay pad having a programmed shift between each pair of periodic patterns in the number m of periodic patterns; and
   each remaining diffraction based overlay pad having a same programmed shift for each pair of periodic patterns as corresponding pair of periodic patterns in the first diffraction based overlay pad except for only one pair of periodic patterns that has a different programmed shift than the corresponding pair of periodic patterns in the first diffraction based overlay pad, wherein for each of the one pair of periodic patterns that has the different programmed shift the different programmed shift is a different value and each of the one pair of periodic patterns that has the different programmed shift corresponds to a different pair of periodic patterns in the first diffraction based overlay pad.

10. The alignment target of claim 9, wherein a magnitude of each of the programmed shifts in the first diffraction based overlay pad is non-zero.

11. The alignment target of claim 9, wherein at least two of the periodic patterns in each diffraction based overlay pad is on a same layer.

12. The alignment target of claim 9, wherein each of the periodic patterns in each diffraction based overlay pad is on a different layer.

13. The alignment target of claim 9, wherein the diffraction based overlay pads have the same physical configuration as the structure except for the programmed shift between each pair of periodic patterns.

14. An apparatus for simultaneously determining n overlay errors in a structure, using a target having a plurality of diffraction based overlay pads, each diffraction based overlay pad having a number m of periodic patterns, where n≥2 and m=n+1, the apparatus comprising:
   a radiation source for producing radiation to be incident on the plurality of diffraction based overlay pads, wherein the target comprises:
      a first diffraction based overlay pad having a programmed shift between each pair of periodic patterns in the number m of periodic patterns; and each remaining diffraction based overlay pad having a same programmed shift for each pair of periodic patterns as a corresponding pair of periodic patterns in the first diffraction based overlay pad except for only one pair of periodic patterns that has a different programmed shift than the corresponding pair of periodic patterns in the first diffraction based overlay pad, wherein for each of the one pair of periodic patterns that has the different programmed shift the different programmed shift is a different value and each of the one pair of periodic patterns that has the different programmed shift corresponds to a different pair of periodic patterns in the first diffraction based overlay pad;

a detector for detecting spectra after the radiation interacts with the plurality of diffraction based overlay pads; and a computer and a non-transitory computer-usable medium having computer-readable program code embodied therein for causing the computer to use differential signals from the detected radiation from different pairs of the plurality of diffraction based overlay pads to simultaneously determine the n overlay errors based on the programmed shift between each pair of periodic patterns.

15. The apparatus of claim 14, wherein a magnitude of each of the programmed shifts in the first diffraction based overlay pad is non-zero.

16. The apparatus of claim 14, wherein at least two of the periodic patterns in each diffraction based overlay pad is on a same layer.

17. The apparatus of claim 14, wherein each of the periodic patterns in each diffraction based overlay pad is on a different layer.

18. The apparatus of claim 14, wherein the diffraction based overlay pads have the same physical configuration as the structure except for the programmed shift between each pair of periodic patterns.

19. The apparatus of claim 14, wherein the apparatus is an ellipsometer.

20. The apparatus of claim 14, wherein the computer-readable program code causes the computer to use Mueller matrices as the differential signals to simultaneously determine the n overlay errors.

21. The apparatus of claim 20, wherein the computer-readable program code causes the computer to use a subset of elements from the Mueller matrices to simultaneously determine the n overlay errors.

22. A method of simultaneously measuring n overlay errors in a structure, the method comprising:

illuminating a target with incident radiation, the target having a plurality of diffraction based overlay pads, each diffraction based overlay pad having a number m of periodic patterns, where n≥2 and m=n+1, and wherein the target comprises:

a first diffraction based overlay pad having a first set of programmed shifts between pairs of periodic patterns in the number m of periodic patterns;

a second diffraction based overlay pad having a second set of programmed shifts between corresponding pairs of periodic patterns, wherein each corresponding pair of periodic patterns has different programmed shifts in the first set and the second set;

each remaining diffraction based overlay pad in the plurality of diffraction based overlay pads having a same programmed shift for each pair of periodic patterns as a corresponding pair of periodic patterns in either the first diffraction based overlay pad or the second diffraction based overlay pad except for only one pair of periodic patterns that has a different programmed shift than the corresponding pair of periodic patterns in the either of the first diffraction based overlay pad or the second diffraction based overlay pad, wherein for each of the one pair of periodic patterns that has the different programmed shift the different programmed shift is a different value and each of the one pair of periodic patterns that has the different programmed shift corresponds to a different pair of periodic patterns in either the first diffraction based overlay pad or the second diffraction based overlay pad;

detecting radiation from the target after the incident radiation interacts with the plurality of diffraction based pads; and using differential signals from the detected radiation from different pairs of the plurality of diffraction based overlay pads to simultaneously determine the n overlay errors based on the different programmed shift between each pair of periodic patterns.

23. The method of claim 22, wherein magnitudes of the programmed shifts in the first diffraction based overlay pad and the programmed shifts in the second diffraction based overlay pad are non-zero.

24. The method of claim 22, wherein at least two of the periodic patterns in each diffraction based overlay pad is on a same layer.

25. The method of claim 22, wherein each of the periodic patterns in each diffraction based overlay pad is on a different layer.

26. The method of claim 22, wherein the diffraction based overlay pads have the same physical configuration as the structure except for the programmed shift between each pair of periodic patterns.

27. The method of claim 22, wherein illuminating the target and detecting radiation is performed using a normal incidence reflectometer.

28. The method of claim 22, wherein using the differential signals from the detected radiation comprises using Mueller matrices.

29. The method of claim 28, wherein a subset of elements from the Mueller matrices are used.

30. An alignment target for simultaneously determining n overlay errors in a structure, the alignment target comprising a plurality of diffraction based overlay pads, each diffraction based overlay pad having a number m of periodic patterns, where n≥2 and m=n+1, and wherein the alignment target comprises:

a first diffraction based overlay pad having a first set of programmed shifts between pairs of periodic patterns in the number m of periodic patterns;

a second diffraction based overlay pad having a second set of programmed shifts between corresponding pairs of periodic patterns, wherein each corresponding pairs of periodic patterns have different programmed shifts in the first set and the second set;

each remaining diffraction based overlay pad in the plurality of diffraction based overlay pads having a same programmed shift for each pair of periodic patterns as a corresponding pair of periodic patterns in either the first diffraction based overlay pad or the second diffraction based overlay pad except for only one pair of periodic patterns that has a different programmed shift than the corresponding pair of periodic patterns in the either of the first diffraction based overlay pad or the second diffraction based overlay pad, wherein for each of the one pair of periodic patterns that has the different programmed shift the different programmed shift is a different value and each of the one pair of periodic patterns that has the different programmed shift corresponds to a different pair of periodic patterns in either the first diffraction based overlay pad or the second diffraction based overlay pad.

31. The alignment target of claim 30, wherein magnitudes of the programmed shifts in the first diffraction based overlay pad and the programmed shifts in the second diffraction based overlay pad are non-zero.

32. The alignment target of claim 30, wherein at least two of the periodic patterns in each diffraction based overlay pad is on a same layer.

33. The alignment target of claim 30, wherein each of the periodic patterns in each diffraction based overlay pad is on a different layer.

34. The alignment target of claim 30, wherein the diffraction based overlay pads have the same physical configuration as the structure except for the programmed shift between each pair of periodic patterns.

35. An apparatus for simultaneously determining n overlay errors in a structure, using a target having a plurality of diffraction based overlay pads, each diffraction based overlay pad having a number m of periodic patterns, where n≥2 and m=n+1, the apparatus comprising:
 a radiation source for producing radiation to be incident on the plurality of diffraction based overlay pads, wherein the target comprises:
  a first diffraction based overlay pad having a first set of programmed shifts between pairs of periodic patterns in the number m of periodic patterns;
  a second diffraction based overlay pad having a second set of programmed shifts between corresponding pairs of periodic patterns, wherein each corresponding pairs of periodic patterns have different programmed shifts in the first set and the second set;
  each remaining diffraction based overlay pad in the plurality of diffraction based overlay pads having a same programmed shift for each pair of periodic patterns as a corresponding pair of periodic patterns in either the first diffraction based overlay pad or the second diffraction based overlay pad except for only one pair of periodic patterns that has a different programmed shift than the corresponding pair of periodic patterns in the either of the first diffraction based overlay pad or the second diffraction based overlay pad, wherein for each of the one pair of periodic patterns that has the different programmed shift the different programmed shift is a different value and each of the one pair of periodic patterns that has the different programmed shift corresponds to a different pair of periodic patterns in either the first diffraction based overlay pad or the second diffraction based overlay pad;
 a detector for detecting spectra after the radiation interacts with the plurality of diffraction based overlay pads; and
 a computer and a non-transitory computer-usable medium having computer-readable program code embodied therein for causing the computer to use differential signals from the detected radiation from different pairs of the plurality of diffraction based overlay pads to simultaneously determine the n overlay errors based on the program shift between each pair of periodic patterns.

36. The apparatus of claim 35, wherein magnitudes of the programmed shifts in the first diffraction based overlay pad and the programmed shifts in the second diffraction based overlay pad are non-zero.

37. The apparatus of claim 35, wherein at least two of the periodic patterns in each diffraction based overlay pad is on a same layer.

38. The apparatus of claim 35, wherein each of the periodic patterns in each diffraction based overlay pad is on a different layer.

39. The apparatus of claim 35, wherein the diffraction based overlay pads have the same physical configuration as the structure except for the programmed shift between each pair of periodic patterns.

40. The apparatus of claim 35, wherein the apparatus is a normal incidence reflectometer.

41. The apparatus of claim 35, wherein the computer-readable program code causes the computer to use Mueller matrices as the differential signals to simultaneously determine the n overlay errors.

42. The apparatus of claim 41, wherein the computer-readable program code causes the computer to use a subset of elements from the Mueller matrices to simultaneously determine the n overlay errors.

* * * * *